United States Patent [19]
Endo et al.

[11] Patent Number: 5,535,169
[45] Date of Patent: Jul. 9, 1996

[54] SEMICONDUCTOR MEMORY DEVICE

[75] Inventors: Tetsuya Endo; Hirohiko Mochizuki; Yukinori Kodama; Yoshihiro Takemae, all of Kawasaki, Japan

[73] Assignee: Fujitsu Limited, Kawasaki, Japan

[21] Appl. No.: 322,564

[22] Filed: Oct. 13, 1994

[30] Foreign Application Priority Data

Dec. 28, 1993 [JP] Japan .................................. 5-337220

[51] Int. Cl.$^6$ ........................................................ G11C 8/00
[52] U.S. Cl. .................... 365/230.03; 365/222; 365/233; 365/239
[58] Field of Search ............................. 365/230.03, 222, 365/194, 233, 189.05, 239

[56] References Cited

U.S. PATENT DOCUMENTS 5,216,635  6/1993  Kass et al. ............................. 365/222
5,251,176  10/1993  Komatsu ............................. 365/222 X
5,251,178  10/1993  Childers ......................... 365/230.03 X
5,335,201  8/1994  Walther et al. ................. 365/230.03 X Primary Examiner—David C. Nelms
Assistant Examiner—Huan Hoang
Attorney, Agent, or Firm—Nikaido, Marmelstein, Murray & Oram

[57] ABSTRACT

A semiconductor memory device includes a plurality of banks each having a memory cell array and sense amplifiers, a data input/output circuit and an address circuit. A first part of the device receives control signals from an outside of the semiconductor memory device and generates a refresh signal therefrom. A second part generates bank select signals in response to the refresh signal, the bank select signals being used to select the plurality of banks. A third part receives the bank select signals and generating latch enable signals therefrom, the latch enable signals driving the sense amplifiers provided in the plurality of banks. A refresh operation is carried out by activating the sense amplifiers by using the latch enable signals.

11 Claims, 15 Drawing Sheets

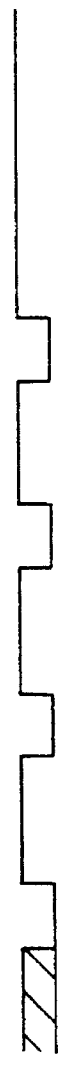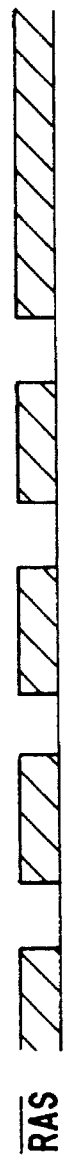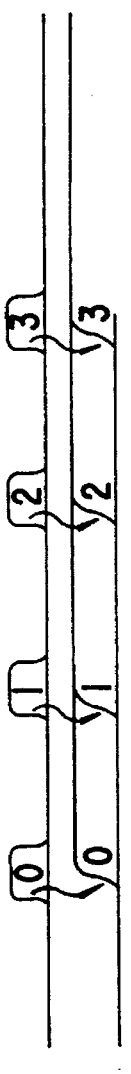
FIG.2A PRIOR ART — CLK
FIG.2B PRIOR ART — CKE
FIG.2C PRIOR ART — $\overline{CS}$
FIG.2D PRIOR ART — $\overline{RAS}$
FIG.2E PRIOR ART — $\overline{CAS}$
FIG.2F PRIOR ART — WE
FIG.2G PRIOR ART — BS
FIG.2H PRIOR ART — LE

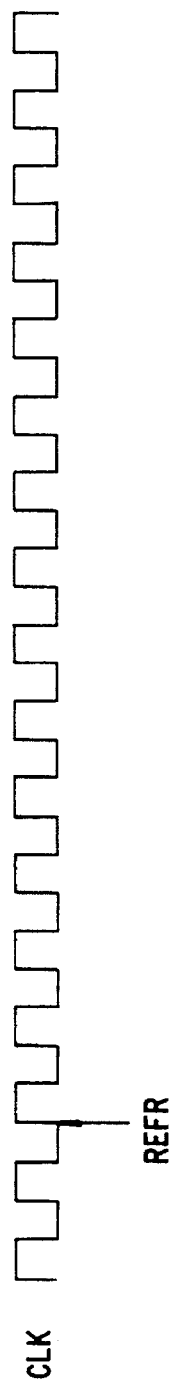
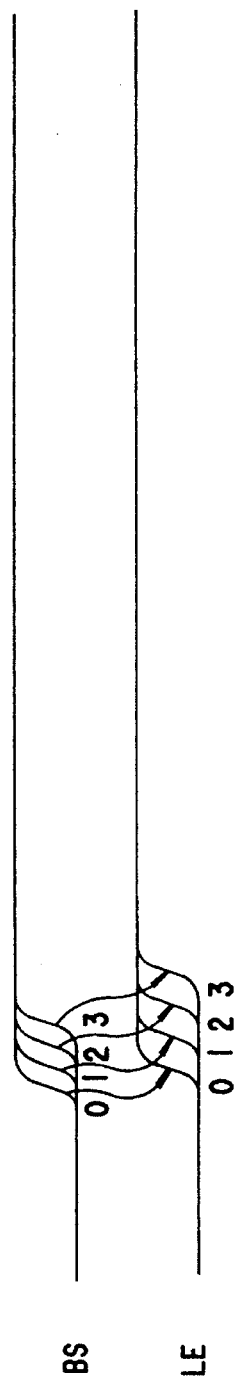
FIG.4A CLK
FIG.4B $\overline{CS}$
FIG.4C $\overline{RAS}$
FIG.4D $\overline{CAS}$
FIG.4E WE
FIG.4F BS
FIG.4G LE

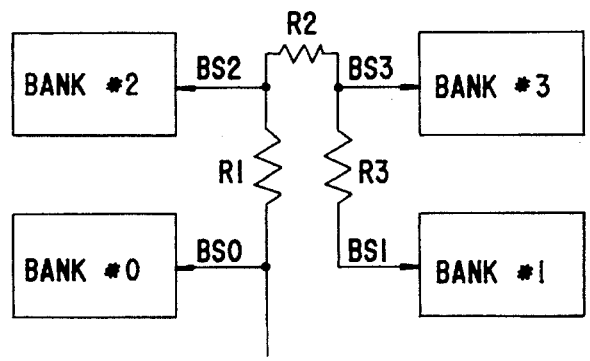
FIG.11
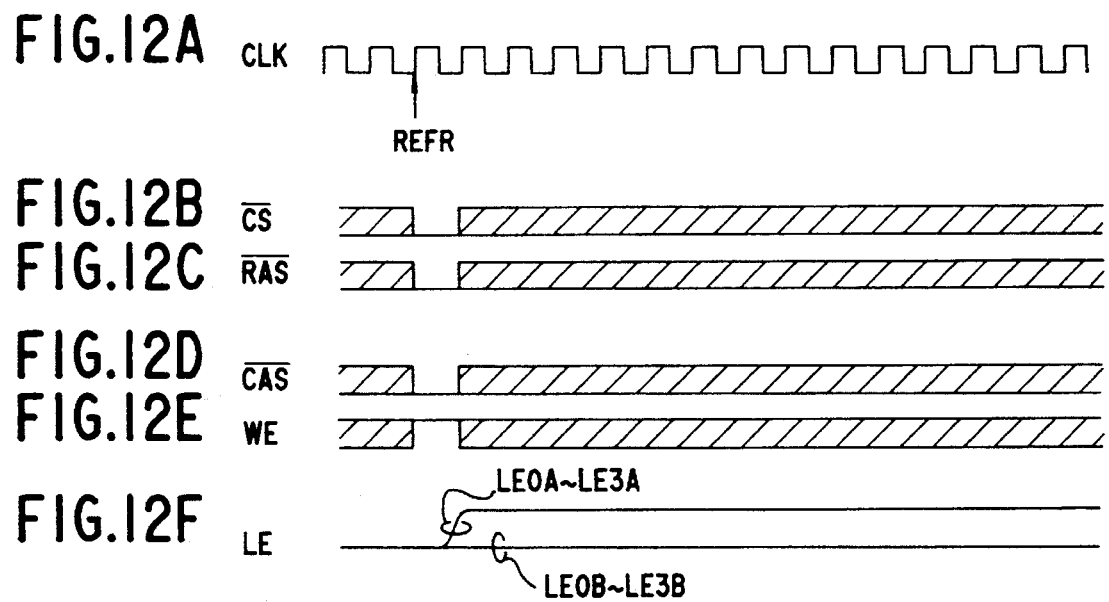

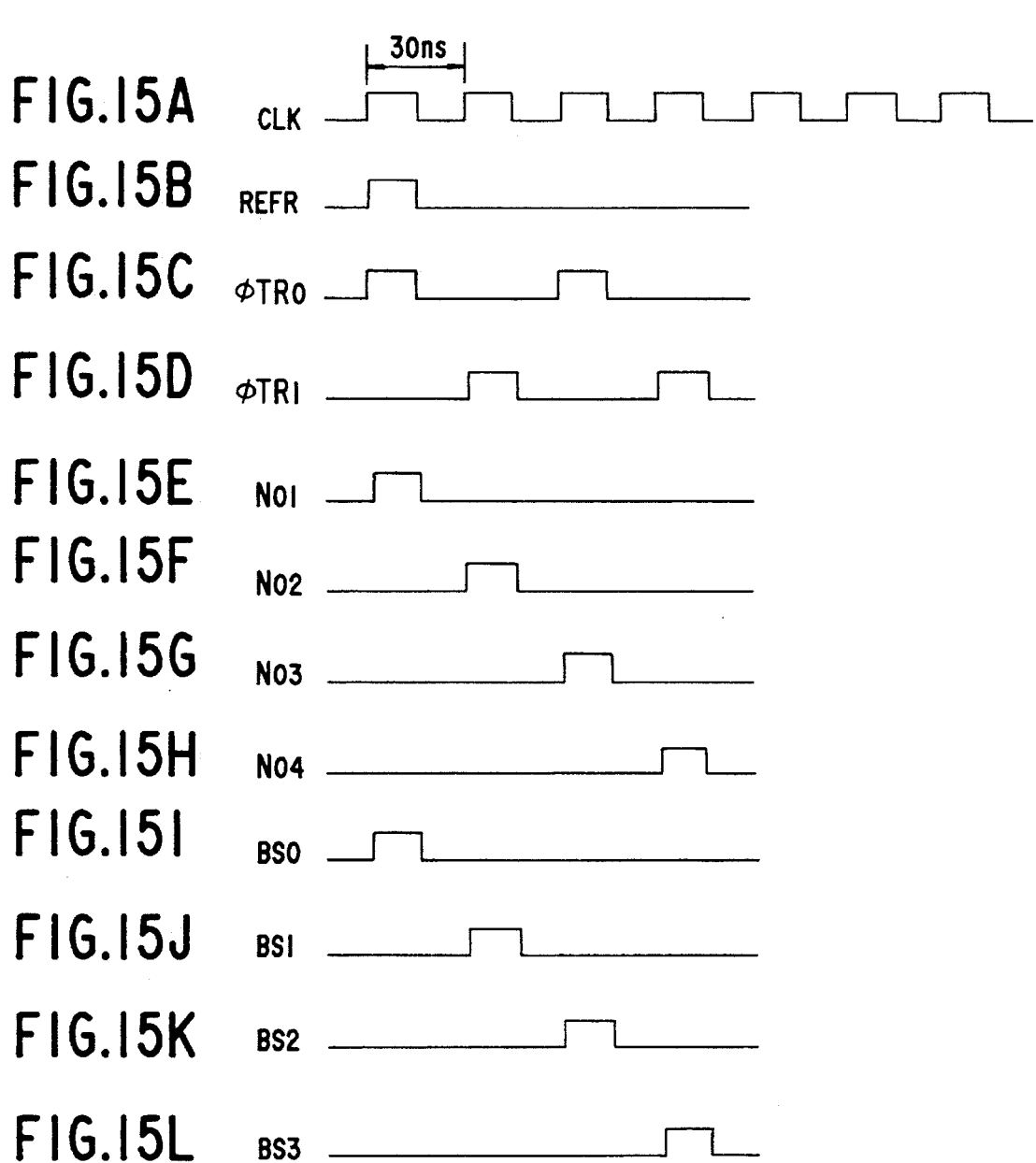

FIG.16A CLK 
FIG.16B REFR 
FIG.16C φTR0 
FIG.16D φTR1 
FIG.16E N01 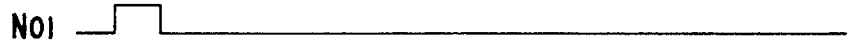
FIG.16F N02 
FIG.16G N03 
FIG.16H N04 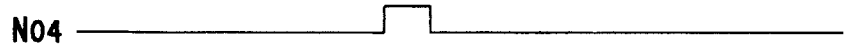
FIG.16I N05 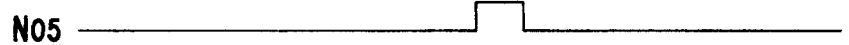
FIG.16J N06 
FIG.16K N07 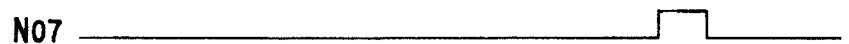
FIG.16L N08 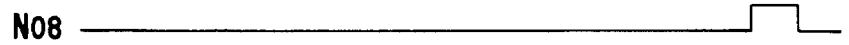
FIG.16M BS0 
FIG.16N BS1 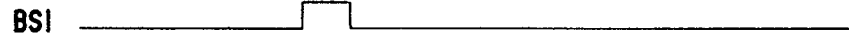
FIG.16O BS2 
FIG.16P BS3 

FIG.17A CLK
FIG.17B REFR
FIG.17C φTR0
FIG.17D φTR1
FIG.17E N01
FIG.17F N02
FIG.17G N03
FIG.17H N04
FIG.17I N05
FIG.17J N06
FIG.17K N07
FIG.17L N08
FIG.17M N09
FIG.17N N010
FIG.17O BS0
FIG.17P BS1
FIG.17Q BS2
FIG.17R BS3
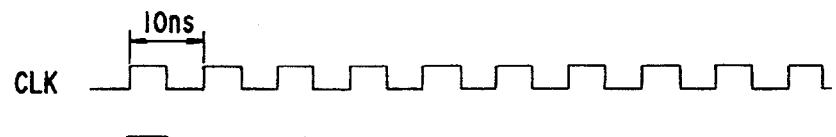
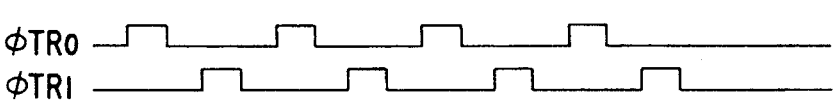
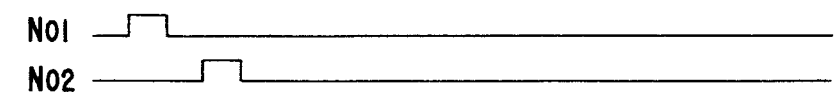
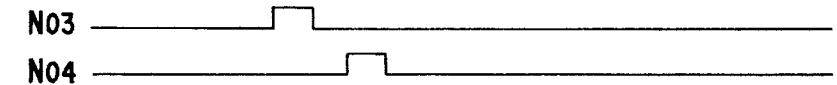
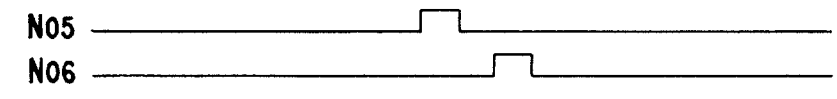
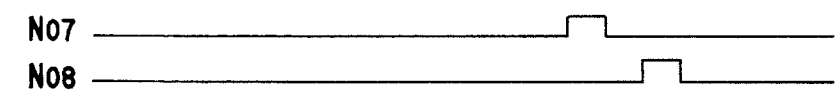
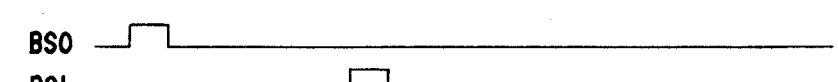
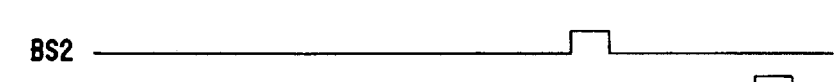

SEMICONDUCTOR MEMORY DEVICE

BACKGROUND OF THE INVENTION

1. Field of the Invention

The present invention generally relates to semiconductor memory devices, and more particularly to a synchronization-type semiconductor memory device such as a synchronous DRAM (Dynamic Random Access Memory) device which operates in synchronism with a clock signal supplied from the outside of the device. More strictly, the present invention is concerned with the refresh operation of the synchronous DRAM device.

Nowadays, various semiconductor memory devices have been proposed and practically used. The integration density of DRAM devices has been drastically increased to 16 Mbits, 64 Mbits and 256 Mbits. With the development of DRAM devices having a large storage capacity, various types of DRAM devices have been proposed in order to meet various requirements. A synchronous DRAM device has been recently proposed which is intended to reduce the cycle time of the serial access and establish the high-speed interface. The synchronous DRAM device is operated in synchronism with an external clock signal and is capable of transferring data at high speed.

2. Description of Prior Art

In the synchronous DRAM, a memory cell array is divided into a plurality of blocks, which are called banks and are operated in the interleaving formation.

FIG. 1 is a block diagram of essential parts of a conventional synchronous DRAM device having four banks #0–#3. A clock buffer 10 outputs internal clock signals on the basis of an external clock signal CLK and a clock control signal CKE. A command decoder 12 decodes a chip select signal /CS ("/" corresponds to the bar marking-above the signal CS shown in FIG. 1), a row address strobe signal /RAS, a column address strobe signal /CAS and a write enable signal /WE, and generates internal control signals. The signals applied to the command decoder 12 are supplied from the outside the synchronous DRAM devices. An address buffer 14 receives an external address signal having address bits A0–A11 and a refresh address signal supplied from a refresh address counter 24, and selectively outputs these signals to a mode register 20 and a write line driving circuit 26. An I/O data buffer and register 16 temporarily stores data signals DQ0–DQ7 and performs the input/output operation thereon. In the refresh operation, data read from the banks is temporarily stored in the I/O data buffer and register 16 and outputs the read data to the input sides of the banks. A signal DQM controls the outputting of data.

Control signal latch circuits 18 are provided with respect to the four banks #0–#3, and latch the row address strobe signal RAS, the column address strobe signal CAS and the write enable signal WE output by the command decoder 12, and output these signals to the banks #0–#3. For the sake of simplicity, FIG. 1 is illustrated so that the control signals are output to banks #0 and #1 only. A mode register 20 determines an internal operation (for example, the timing of operation) on the basis of the associated control signal from the command decoder 12 and the address signal from the address buffer 14. Column address counters 22 are provided with respect to four banks #0 –#3. Internal counters provided in the counters 22 are operated in response to the address signal, and bit lines of banks #0–#3 are selected.

The refresh address counter 24 generates the refresh address for driving word lines of banks #0–#3 in the refresh operation, and outputs the refresh address to the address buffer 14. A word line driving circuit 26 receives the address signal from the address buffer 14, the control signal from the control signal latch circuit 18 and bank select signals BS0–BS3 from a bank select/latch enable signal circuit 28, and selectively drives the word lines of banks #0–#3. The bank select/latch enable circuit 28 receives the control signal from the command decoder 12 and outputs the bank select signals BS0–BS3 and latch enable signals LE0–LE3 for driving sense amplifiers (which are omitted in FIG. 1) provided in banks #0–#3.

A description will be given, with reference to FIG. 2, of the refresh operation of the synchronous DRAM device shown in FIG. 1.

The external clock signal CLK from the clock buffer 10 is output to the parts of the synchronous DRAM device in the state in which the clock control signal CKE externally supplied from the outside and used to control the internal clock signals is maintained at the high level. The command decoder 12 decodes the chip select signal /CS, the row address strobe signal /RAS and the column address strobe signal /CAS, and outputs a refresh signal REFR (signal indicated by *2 in FIG. 1) to the bank select/latch enable circuit 28 when the received signals all switch to the low level. The bank select/latch enable circuit 28 sequentially outputs the bank select signals BS0–BS3 one by one each time receiving the refresh signal REFR. In the example shown in FIG. 2, the bank select signals BS0–BS3 are output one by one in this order. Further, the bank select/latch enable circuit 28 sequentially outputs the latch enable signals LE0–LE3 each time one of the bank select signals BS0–BS3 is output. In addition to the above-mentioned three control signals, there is a case where the refresh signal is generated using the write enable signal /WE.

The word line driving circuit 26 selects bank #0 in response to the bank select signal BS0, and selects a word line of bank #0 corresponding to the refresh address received from the refresh address counter 24 via the address buffer 14. Then, the refresh operation is carried out. In the refresh operation, the latch enable signal LE0 is output in response to the bank select signal BS0. The address buffer 14 includes a built-in select circuit, which receives the refresh signal from the command decoder 12 and selects the refresh address. In FIG. 2, although the latch enable signal is depicted so that it is ON, the latch enable signal is disabled at a predetermined timing.

The above operation is repeatedly carried out so that banks #0–#3 are selected one by one, and the word lines are sequentially selected.

However, the synchronous DRAM device described with reference to FIGS. 1 and 2 has the following disadvantages.

The refresh signal REFR determining the refresh operation for each bank is generated from the externally supplied signals, that is, the chip select signal /CS, the row address strobe signal /RAS and the column address strobe signal /CAS. These control signals can be arbitrarily determined by the users of the synchronous DRAM devices.

As the integration density becomes higher, the refresh operation is required to be performed at higher speed. Hence, it is necessary to switch the chip select signal /CS, the row address strobe signal /RAS and the column address strobe signal /CAS at a higher speed to thereby select the four banks one by one at a higher speed. However, the setting of high-speed switching of the chip select signal /CS, the row address strobe signal /RAS and the column address strobe signal /CAS needs a large load of the users and is not desirable. In order to access the four banks one by one in the refresh operation, it is necessary to generate the refresh signal at a high speed four times. Even when the setting of high-speed switching is carried out by the manufacturer, it is very difficult to set the chip select signal /CS, the row address strobe signal /RAS and the column address strobe signal /CAS at a high speed to attempt speeding-up of the operation shown in FIG. 2.

SUMMARY OF THE INVENTION

It is a general object of the present invention to provide a semiconductor memory device in which the above disadvantages are eliminated.

A more specific object of the present invention is to provide a semiconductor memory device having the function of performing the refresh operation on a plurality of banks by means of simple control performed from the outside of the device.

The above objects of the present invention are achieved by a semiconductor memory device including a plurality of banks each having a memory cell array and sense amplifiers, a data input/output circuit and an address circuit, said semiconductor memory device comprising:

first means for receiving control signals from an outside of the semiconductor memory device and for generating a refresh signal therefrom;

second means for generating bank select signals in response to the refresh signal, the bank select signals being used to select the plurality of banks;

third means for receiving the bank select signals and generating latch enable signals therefrom, the latch enable signals driving the sense amplifiers provided in the plurality of banks, a refresh operation being carried out by activating the sense amplifiers by the latch enable signals.

BRIEF DESCRIPTION OF THE DRAWINGS

Other objects, features and advantages of the present invention will become more apparent from the following detailed description when read in conjunction with the accompanying drawings, in which:

FIG. 2 is a timing chart of the operation of the synchronous DRAM device shown in FIG. 1;

FIG. 4 is a timing chart of the operation of the structure shown in FIG. 3;

FIG. 11 is a block diagram of another structure of the automatic bank select signal generating circuit shown in FIGS. 3 and 5;

FIG. 12 is a timing chart of a second embodiment of the present invention;

FIG. 15 is a timing chart of a first operation of the third embodiment of the present invention;

FIG. 16 is a timing chart of a second operation of the third embodiment of the present invention;

FIG. 17 is a timing chart of a third operation of the third embodiment of the present invention.

DESCRIPTION OF THE PREFERRED EMBODIMENTS

Figure 3:
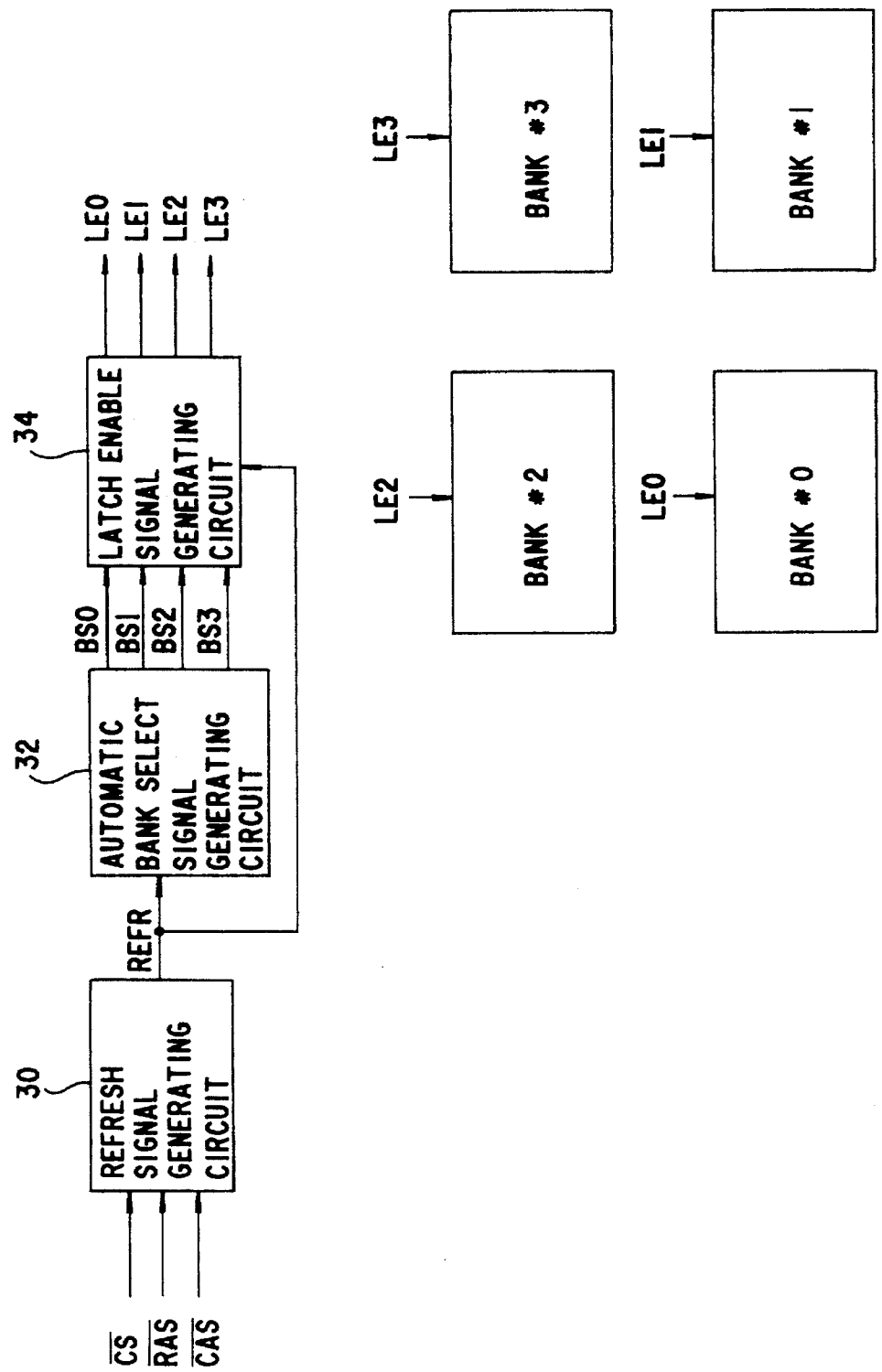
FIG. 3 is a block diagram of the principle of the present invention.

FIG. 3 is a block diagram of the principle of the present invention. A refresh signal generating circuit 30 receives control signals supplied from the outside of the circuit 30, and generates a refresh signal therefrom. In the example shown in FIG. 3, the refresh signal generating circuit 30 generates the refresh signal REFR from the chip select signal /CS, the row address strobe signal /RAS and the column address strobe signal /CAS. The control signals from the outside of the circuit 30 are generated one time with respect to one access operation in which a plurality of banks (four banks #0–#3 in the refresh operation are sequentially accessed one time. In the aforementioned prior art, there is a need to generate the control signals four times in order to access four banks #0–#3.

An automatic bank select signal generating circuit 32 receives the above refresh signal REFR, and automatically outputs bank select signals BS0–BS3 used to sequentially select four banks #0–#3 one by one. A latch enable signal generating circuit 34 generates, from the refresh signal REFR and the bank select signals BS0–BS3, latch enable signals LE0– LE3 used to activate sense amplifiers provided in banks #0–#3.

FIG. 4 is a timing chart of the operation of the structure shown in FIG. 3. In synchronism with the clock signal CLK supplied from the outside, the refresh signal generating circuit 30 receives the chip select signal /CS, the row address strobe signal /RAS and the column address strobe signal /CAS, and generates the refresh signal REFR. As shown in FIG. 4, the chip select signal /CS, the row address strobe signal /RAS and the column address strobe signal /CAS are generated only one time with respect to four banks #0–#3. In other words, in order to select four banks #0–#3, the chip select signal /CS, the row address strobe signal /RAS and the column address strobe signal /CAS are changed only one time as shown in FIG. 4.

The automatic bank select signal generating circuit 32 automatically generates the four bank select signals BS0–BS3 in response to the refresh signal REFR. In the example shown in FIG. 4, the four bank select signals BS0–BS3 are sequentially generated at time intervals in response to the refresh signal REFR. The latch enable signal generating circuit 34 generates the latch enable signals LE0–LE3 from the bank select signals BS0–BS3 output by the automatic bank select signal generating circuit 32 as well as the refresh signal, and outputs these signals to banks #0–#3, respectively.

As described above, the external control signals are controlled only one time in order to generate the refresh signal REFR one time to refresh four banks #0–#3. Hence, the disadvantages of the prior art are eliminated.

Figure 5:
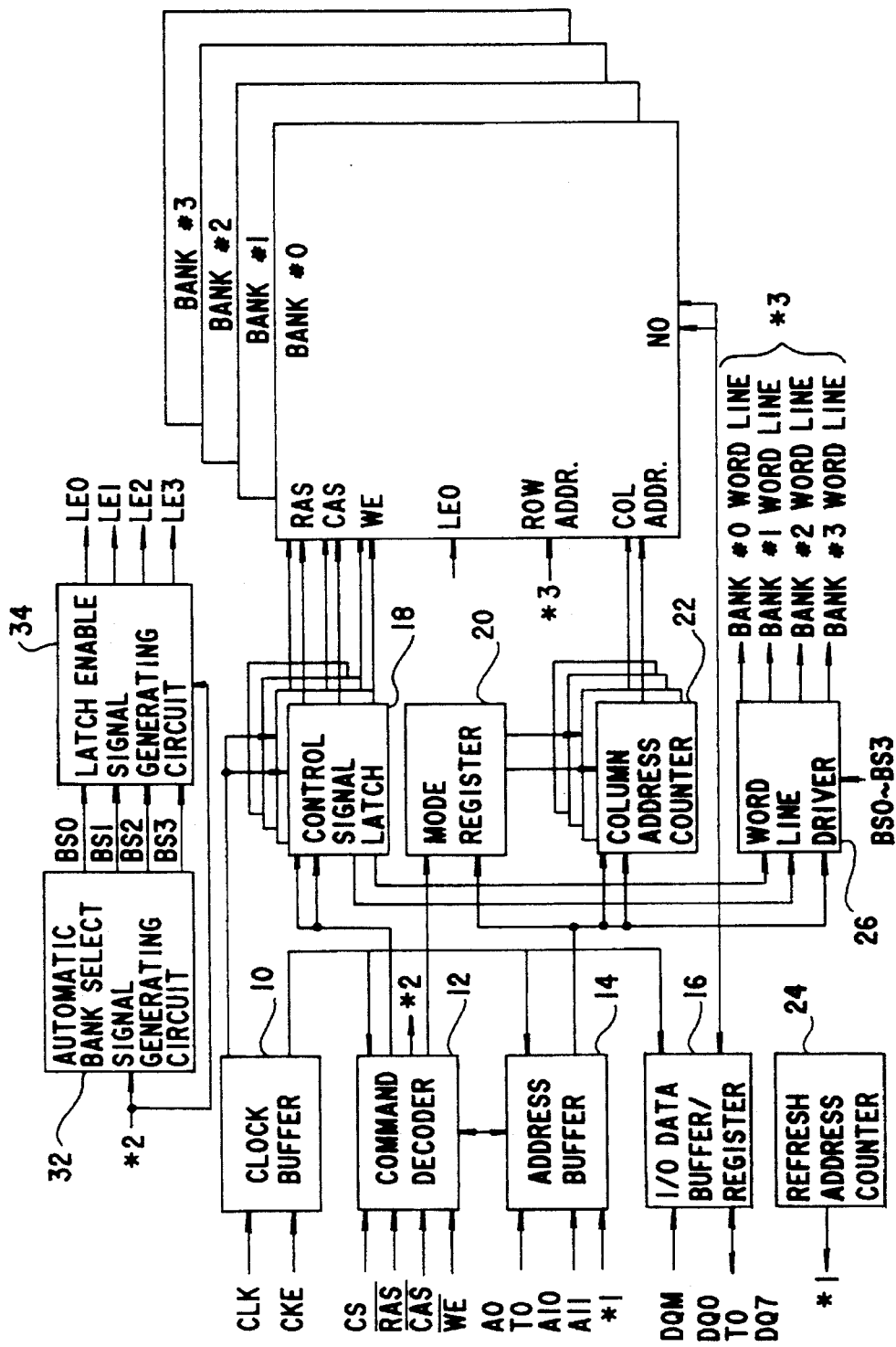
FIG. 5 is a block diagram of a first embodiment of the present invention.

FIG. 5 is a block diagram of the structure of an overall synchronous DRAM device according to a first embodiment of the present invention. In FIG. 5, parts that are the same as those shown in the previously described figures are given the same reference numbers.

Figure 1:
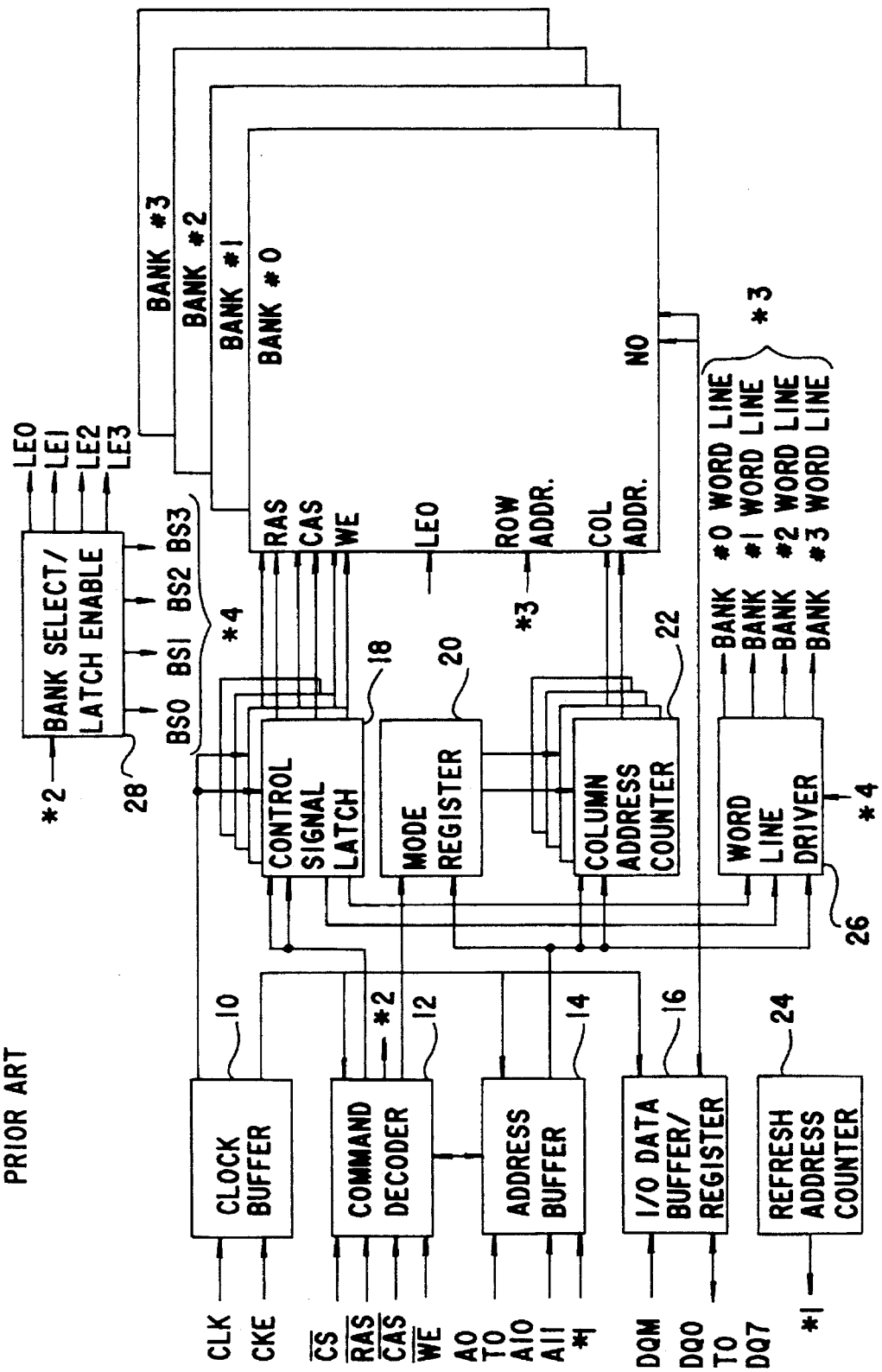
FIG. 1 is a block diagram of essential parts of a conventional synchronous DRAM device.

In the structure shown in FIG. 5, the automatic bank select signal generating circuit 32 and the latch enable signal 34 are substituted for the bank select/latch enable circuit 28 shown in FIG. 1. The refresh signal generating circuit 30 shown in FIG. 3 is provided within the command decoder 12. The refresh operation of the synchronous DRAM device shown in FIG. 5 is the same as shown in FIG. 4. As has been described previously, the refresh signal REFR is generated only one time in order to sequentially refresh four banks #0–#3 one time. Hence, the external control signals are changed only one time in order to generate the above refresh signal REFR. As shown in FIG. 4, when the refresh signal REFR is received, the bank select signals BS0–BS3 are generated in asynchronism with the external clock signal.

Further, the refresh operation shown in FIG. 4 is superior to the refresh operation shown in FIG. 2 in the following point. The bank select signals BS0–BS3 and the latch enable signal LE0–LE3 are sequentially generated with predetermined small time differences with respect to one generation of the refresh signal REFR. Hence, when the bank select signal BS3 is output and the latch select signal LE3 is output in response to the signal BS3, four banks #0–#3 are selected and the sense amplifiers thereof are in the activated state.

In the refresh operation shown in FIG. 2, four banks #0–#3 are sequentially selected within a term equal to three clock cycles of the external clock signal CLK, and the sense amplifiers of four banks #0–#3 are sequentially activated. Hence, it takes a long time to complete the refresh operation on four banks #0–#3 (an increase in the number of refresh cycles), the busy rate of the synchronous DRAM considered from an external perspective of the synchronous DRAM is degraded.

Figure 6:
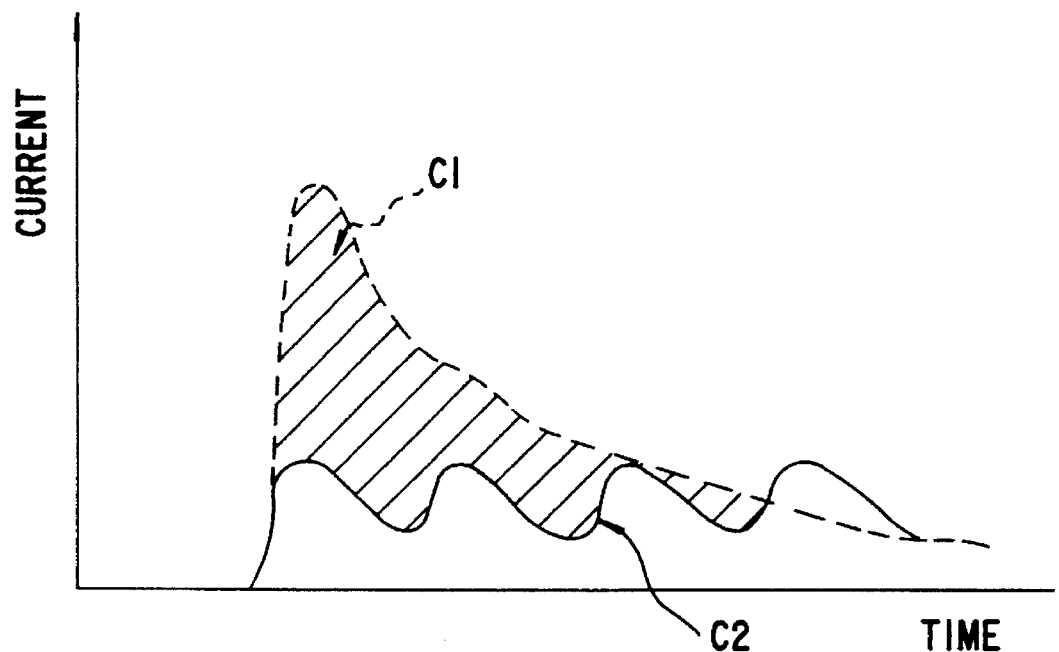
FIG. 6 is a graph showing advantages of the first embodiment of the present invention.

In order to overcome the above disadvantage, one may consider an arrangement in which four banks #0–#3 are simultaneously selected and all the sense amplifiers provided in the four banks are concurrently driven. In the above arrangement, it is possible to reduce the time necessary to complete the refresh operation. However, as shown by curve C1 shown in FIG. 6, currents simultaneously flow in the sense amplifiers, and a large peak current flows in the synchronous DRAM device and a large amount of power is consumed. It will be noted that the horizontal axis of the graph of FIG. 6 denotes time and the vertical axis thereof denotes the amount of current flowing in the DRAM device.

On the other hand, according to the first embodiment of the present invention, the sense amplifiers of banks #0–#3 are sequentially driven at small time intervals in response to the latch enable signals LE0–LE3. Large currents flow in the sense amplifiers and a large amount of power is consumed therein immediately after the sense amplifiers are activated. By driving the sense amplifiers of banks #0–#3 at time intervals, as shown in curve C2 shown in FIG. 6, it is possible to successively put the sense amplifiers of banks #0–#3 in a state in which the peak current flowing in the synchronous DRAM device is suppressed.

As described above, the first embodiment of the present invention eliminates the disadvantages of the prior art shown in FIGS. 1 and 2, and can perform the refresh operation at higher speed in the state in which the peak current flowing in the synchronous DRAM device is suppressed.

Figure 7:
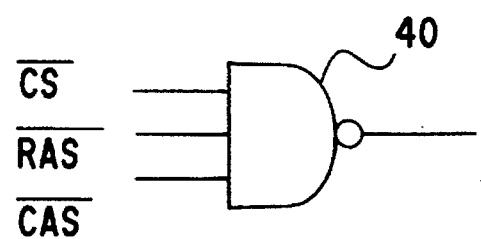
FIG. 7 is a block diagram of a refresh signal generating circuit shown in FIG. 3.

FIG. 7 is a block diagram of an example of the structure of the refresh signal generating circuit 30 shown in FIG. 3. As shown in FIG. 7, the refresh signal generating circuit 30 includes a NAND circuit 40. The NAND circuit 40 receives the chip select signal /CS, the row address strobe signal /RAS and the column address strobe signal /CAS, and generates the refresh signal REFR therefrom. As has been described previously, the write enable signal /WE can be used to generate the refresh signal REFR in addition to the above three signals.

Figure 8:
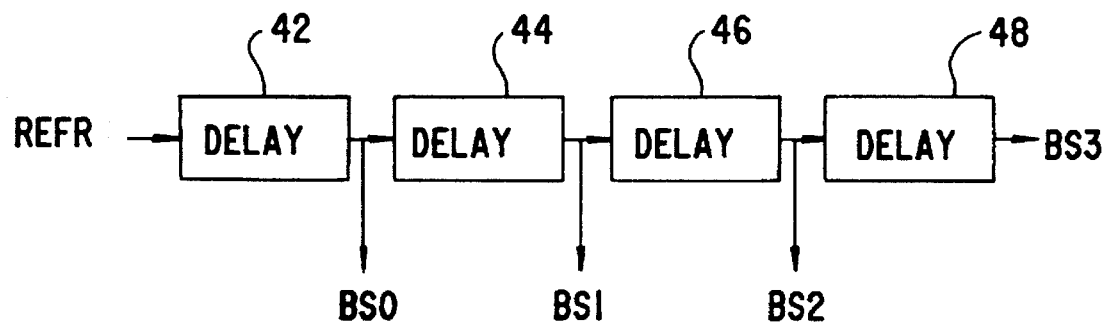
FIG. 8 is a block diagram of an automatic bank select signal generating circuit shown in FIG. 3.

FIG. 8 is a block diagram of the automatic bank select signal generating circuit 32. As shown in FIG. 8, the generating circuit 32 includes four delay circuits 42, 44, 46 and 48. The delay circuit 42 receives the refresh signal REFR, and outputs the bank select signal BS0 by delaying the refresh signal REFR by a predetermined time. The delay circuit 44 delays the bank select signal BS0 by a predetermined time, and outputs the bank select signal BS1. The delay circuit 46 delays the bank select signal BS1 by a predetermined time, and outputs the bank select signal BS2. The delay circuit 48 delays the bank select signal BS1 by a predetermined time, and outputs the bank select signal BS3. The predetermined times related to the delay circuits 42, 44, 46 and 48 may be equal to or different from each other. The delay circuits 42, 44, 46 and 48 can be formed of wires having resistance (see FIG. 11, which will be described later) or inverters. The number of delay circuits is determined taking into account the number of banks.

As shown in FIG. 11, the refresh signal REFR passes through resistors R1, R2 and R3. Generally, the wiring lines have a resistance and a capacitance. Hence, the wiring lines have time constants. The refresh signal REFR passes through the different resistors and different capacitances and are then applied to the banks. In this manner, the bank select signal BS0–BS3 can be generated.

Figure 9:
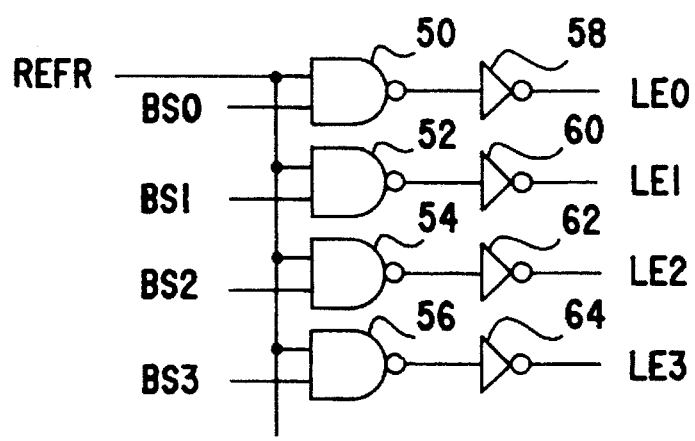
FIG. 9 is a block diagram of a latch enable signal shown in FIGS. 3 and 5.

FIG. 9 is a block diagram of the latch enable signal generating circuit 34. The latch enable signal generating circuit 34 includes NAND circuits 50, 52, 54 and 56 and inverters 58, 60, 62 and 64. The NAND circuits 50, 52, 54 and 56 respectively perform NAND operations on the refresh signal REFR and the bank select signals BS0, BS1, BS2 and BS3, and output the results of the NAND operations to the inverters 58, 60, 62 and 64, which output the latch enable signals LE0, LE1, LE2 and LE3.

Figure 10:
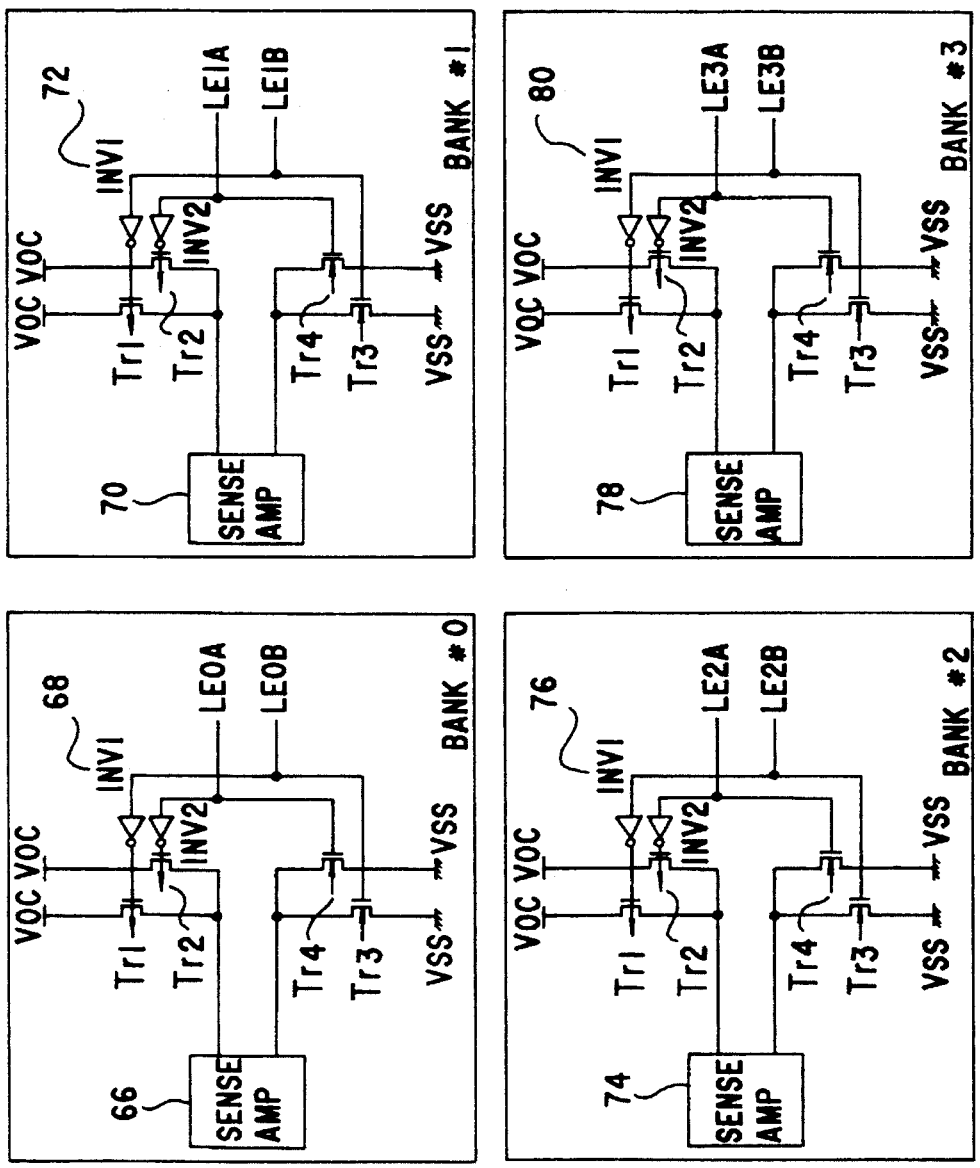
FIG. 10 is a block diagram of sense amplifiers and sense amplifiers' driving circuits provided in banks.

FIG. 10 is a block diagram of sense amplifiers and sense amplifier driving circuits respectively provided in banks #0–#3. In FIG. 10, there is illustrated the structure related to a pair of bit lines in each of the banks. Bank #0 includes a sense amplifier 66 connected to a pair of bit lines, and a sense amplifier driving circuit 68. The sense amplifier driving circuit 68 is made up of P-channel MOS transistors Tr1 and Tr2, N-channel MOS transistors Tr3 and Tr4, and two inverters INV1 and INV2. The latch enable signal LE0 generated by the structure shown in FIG. 9 is applied to the sense amplifier driving circuit 68 as signals LE0A and LE0B. When the signal LE0A is switched to the high level, the sense amplifier 66 is connected to a high-potential power supply line Vcc via a current path including the transistor Tr2, and is connected to a low-potential power supply line Vss via a current path including the transistor Tr4. Hence, the sense amplifier 66 is activated. When the latch enable signal LE0B is switched to the high level, the sense amplifier 66 is connected to the lines Vcc and Vss via current paths respectively having the transistors Tr1 and Tr3. The timings of the signals LE0A–LE3A may be slightly different from those of the signals LE0B–LE3B.

Similarly to the structure of the above-mentioned bank #0, bank #1 includes a sense amplifier 70 and a sense amplifier driving circuit 72, and bank #2 includes a sense amplifier 74 and a sense amplifier driving circuit 76. Further, bank #3 includes a sense amplifier 78 and a sense amplifier driving circuit 80.

A description will now be given of a second embodiment of the present invention. In the first embodiment of the present invention, the drive timings for banks #0–#3 are slightly different from each other (see FIG. 4). According to the second embodiment of the present invention, the driving timings for banks #0–#3 are the same as each other. However, if all the sense amplifiers are driven at the same timing, a large peak current will flow in the synchronous DRAM device, and a large amount of energy will be consumed therein.

FIG. 12 is a timing chart of the operation of the second embodiment of the present invention. As shown in FIG. 12, the latch enable signals LE0A–LE3A are simultaneously switched to the high level at the same time as the refresh signal REFR is output, while the latch enable signals LE0B–LE3B are not switched but maintained at the low level. Hence, only the transistors Tr2 and Tr4 of banks #0–#3 are turned ON, and the driving abilities of the sense amplifiers 66, 70, 74 and 78 become less than those of the sense amplifiers used in the first embodiment of the present invention. Hence, the amount of power consumed in the sense amplifiers 66, 70, 74 and 78 can be reduced.

Figure 13:
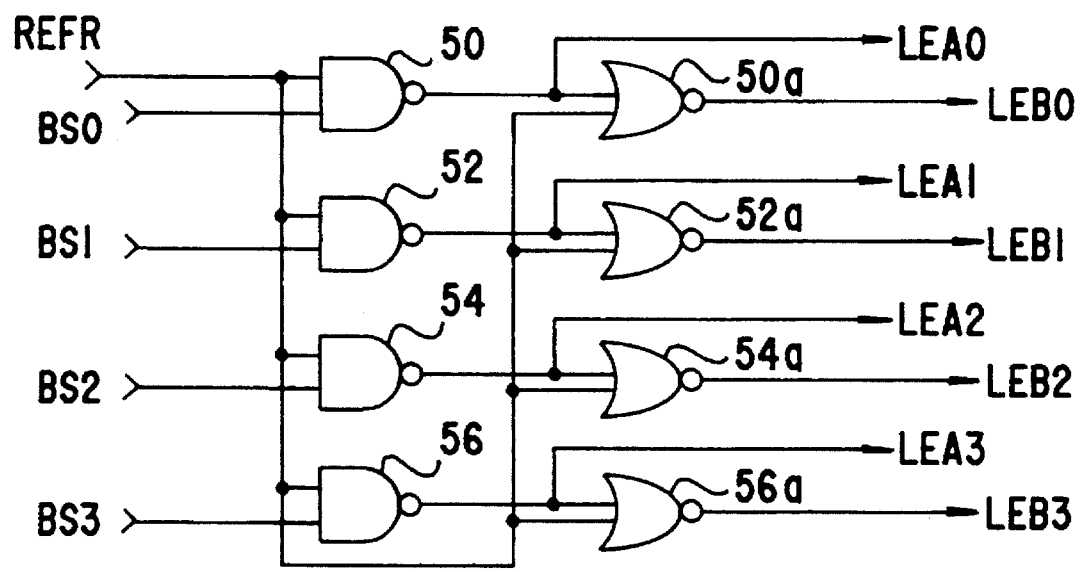
FIG. 13 is a block diagram of an essential part of the second embodiment of the present invention.

FIG. 13 is a block diagram of an essential part of the second embodiment of the present invention. The circuit shown in FIG. 13 is used instead of the latch enable signal generating circuit 34 shown in FIG. 5. The refresh signal REFR is applied to input terminals of the NAND circuits 50, 52, 54 and 56, and the bank select signals BS0, BS1, BS2 and BS3 are respectively applied to the other input terminals thereof. The output signals of the NAND circuits 50, 52, 54 and 56 are used as the latch enable signals LE0A– LE3A, and are applied to NOR circuits 50a, 52a, 54a and 56a, which circuits receive the refresh signal REFR. The output signals of the NOR circuits 50a, 52a, 54a and 56a are used as the latch enable signals LE0B– LE3B. In the refresh operation, the latch enable signals LE0–LE3B are not selected.

A description will now be given of a third embodiment of the present invention, in which a plurality of banks are selected in synchronism with the external clock signal CLK by one change of the refresh signal REFR. The overall structure of the third embodiment of the present invention is the same as that of the first embodiment thereof.

Figure 14:
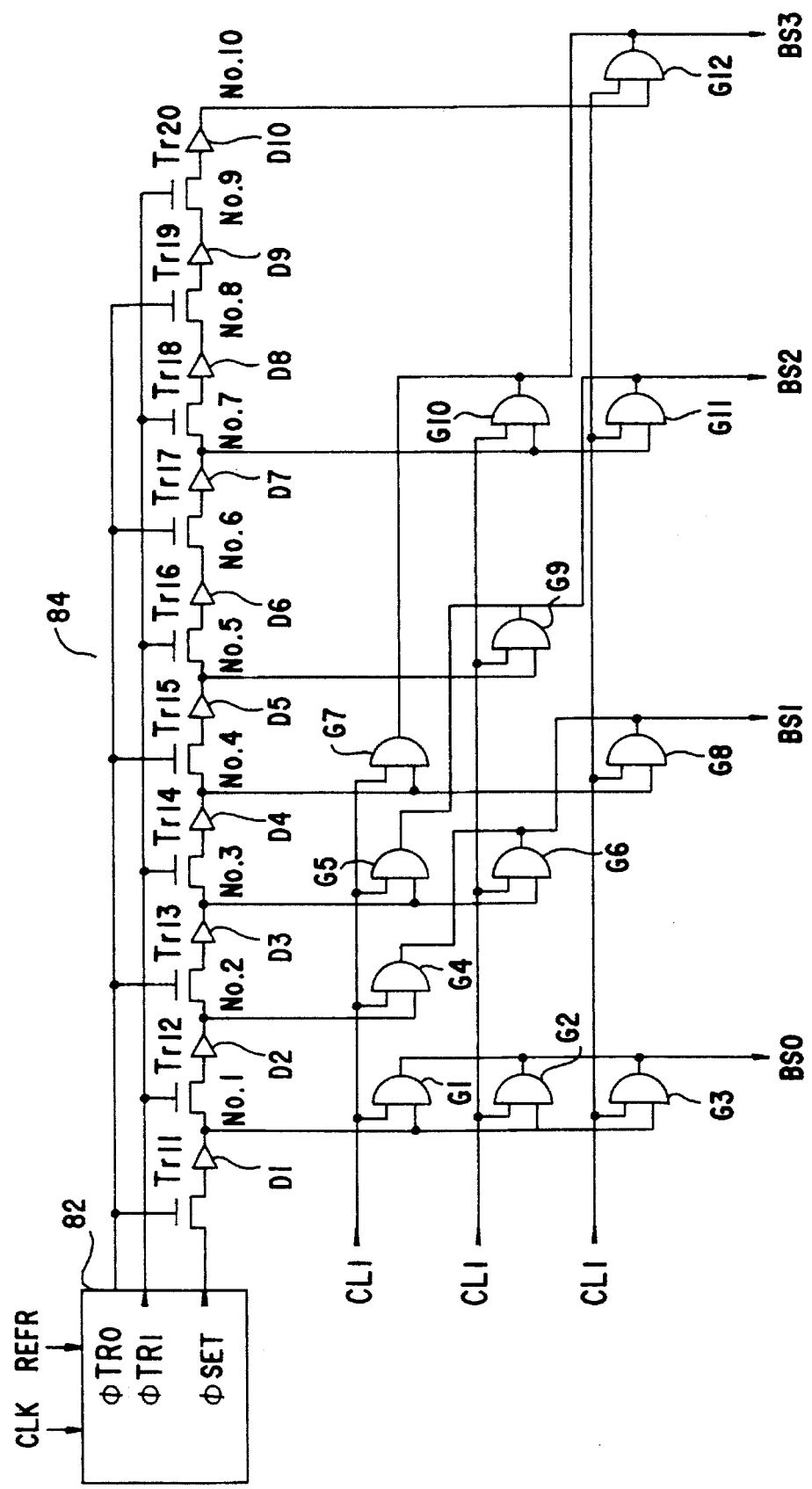
FIG. 14 is a block diagram of an essential part of a third embodiment of the present invention.

FIG. 14 is a circuit diagram of the bank select signal generating circuit 32 according to the third embodiment of the present invention. The circuit 3 shown in FIG. 14 includes a timing generation circuit 82 and a logic circuit 84. The timing generation circuit 82 receives the refresh signal and the external clock signal CLK, and generates timing signals φTR0, φTR1 and φSEL therefrom. The logic circuit 84 includes MOS transistors Tr11–Tr20, delay circuits D1–D10 and AND circuits G1–G12. The timing signal φTR0 is applied to the gates of transistors Tr11, Tr13, Tr15, Tr17 and Tr19. The timing signal TR1 is applied to the gates of the transistors Tr12, Tr14, Tr16, Tr18 and Tr20. The timing signal φSET is shifted via the transistors Tr11–Tr20 and the delay circuits D1–D10. External control signals CL1, CL2 and CL3 are timing signals used to determine banks.

FIG. 15 is a timing chart of an operation of the structure shown in FIG. 14 in which the external control signal CL1 is set to the high level and the other signals are set to the low level. As shown in FIG. 15, the bank select signals BS0–BS3 are sequentially output by AND gates G3, G8, G11 and G12 in synchronism with the rise edges of the external clock signal CLK having a cycle of 30 ns.

FIG. 16 is a timing chart of another operation of the structure shown in FIG. 14 in which the external control signal CL2 is set to the high level and the other external control signals CL1 and CL3 are set to the low level. As shown in FIG. 16, the bank select signals BS0–BS3 are sequentially output in synchronism with every other rise clock of the external clock signal CLK.

FIG. 17 is a timing chart of another operation of the structure shown in FIG. 14 in which the external control signal CL3 is set to the high level and the other external control signals CL1 and CL2 are set to the low level. As shown in FIG. 17, the bank select signals BS0–BS3 are sequentially output in synchronism with every third rise clock of the external clock signal CLK (at intervals of three cycles).

Figure 18:
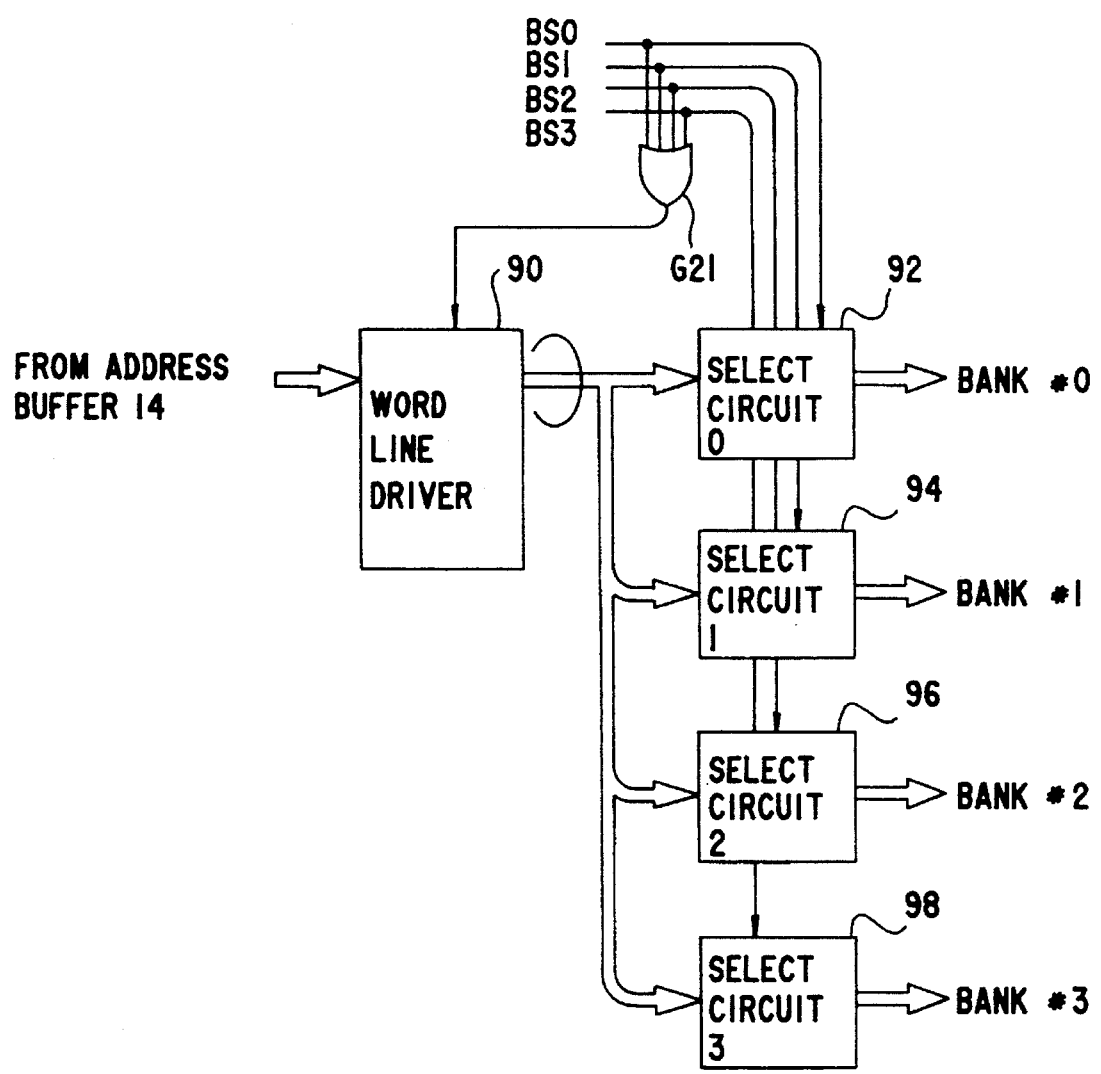
FIG. 18 is a block diagram of a word line driving circuit used in the first, second and third embodiments of the present invention.

The operation shown in FIG. 17 is almost the same as that of the first embodiment of the present invention except for the method of producing the refresh clock signal REFR. Hence, as in the case of the first embodiment of the present invention, the external control signals are controlled only one time in order to generate the refresh signal REFR necessary to refresh four banks #0–#3 one time. Hence, the third embodiment of the present invention has the same advantages as those of the first embodiment thereof. The refresh operations shown in FIGS. 15 and 16 are faster than the refresh operation shown in FIG. 17. FIG. 18 is a block diagram of the word line driving circuit 26 shown in FIG. 5. The structure shown in FIG. 18 is common to the first through third embodiments of the present invention. The word line driving circuit 26 shown in FIG. 18 includes a word line driver 90, selector circuits 92, 94, 96 and 98 and an OR circuit G21. The OR circuit G21 receives the bank select signals BS0–BS3, and outputs the OR output signal to the word line driver 90. The word line driver 90, which operates in synchronism with the OR output signal, receives the address signal from the address buffer 14, and outputs the word line driving signal to the related word line. The select circuits 92, 94, 96 and 98 receives the bank select signals BS0–BS3 and allow passage of the word line driving signal. The select circuits 92, 94, 96 and 98 are connected to the word lines of banks #0–#3.

According to the present invention, the following advantages are obtained.

The bank select signals for selecting a plurality of banks are generated in response to the refresh signal, and the latch enable signals for driving sense amplifiers are generated in response to the bank select signals. Hence, it is possible to determine the timings of the external control signals without taking into consideration the refresh operation performed for each bank. Hence, it is ease to design and control the refresh operation.

The bank select signals are generated at slightly different timings so that the peak currents in the sense amplifiers can be reduced, and the latch enable signals are generated from the above bank select signals. Hence, it is possible to reduce power consumed in the sense amplifiers in which most power is consumed immediately after the sense amplifiers are driven and to perform the refresh operation at higher speed.

The bank select signals are simultaneously generated in response to the refresh signal so that a plurality of banks are simultaneously selected, and sense amplifiers are simultaneously driven so that the peak currents flowing in the sense amplifiers can be reduced. Hence, it is possible to perform the refresh operation at higher speed with reduced consumption of power.

The refresh operation can be performed in synchronism with or in asynchronism with the external clock signal.

The present invention is not limited to the specifically disclosed embodiments, and variations and modifications may be made without departing from the scope of the present invention.

What is claimed is:

1. A semiconductor memory device including a plurality of banks each having a memory cell array and sense amplifiers, a data input/output circuit and an address circuit, said semiconductor memory device comprising:

first means for receiving control signals from an outside of the semiconductor memory device and for generating a refresh signal therefrom;

second means for generating bank select signals in response to the refresh signal, the bank select signals being used to select the plurality of banks;

third means for receiving the bank select signals and generating latch enable signals therefrom, the latch enable signals driving the sense amplifiers provided in the plurality of banks, a refresh operation being carried out by activating the sense amplifiers by the latch enable signals.

2. The semiconductor memory device as claimed in claim 1, wherein the second means comprises fourth means for sequentially generating the bank select signals at predetermined intervals so that peak currents flowing in the sense amplifiers can be reduced.

3. The semiconductor memory device as claimed in claim 1, wherein:

the second means comprises fourth means for simultaneously generating the bank select signals in order to simultaneously select the plurality of banks in response to the refresh signal; and the third means comprises fifth means for receiving the bank select signals simultaneously generated and for generating the latch enable signals so that peak currents flowing in the sense amplifiers can be reduced.

4. The semiconductor memory device as claimed in claim 2, wherein the second means sequentially generates the bank select signals in asynchronism with a clock signal supplied from the outside of the semiconductor memory device.

5. The semiconductor memory device as claimed in claim 2, wherein the second means sequentially generates the bank select signals in synchronism with a clock signal supplied from the outside of the semiconductor memory device.

6. The semiconductor memory device as claimed in claim 3, wherein:

said semiconductor memory device comprises sense amplifier driving means connected to the sense amplifiers;

the sense amplifier driving means comprises a plurality of current paths which selectively connect the sense amplifiers and a power supply system; and the fifth means comprises outputs the latch enable signals to current paths among the plurality of current paths so that the sense amplifiers receiving the latch enable signals are connected to the power supply system.

7. The semiconductor memory device as claimed in claim 1, wherein the semiconductor memory device is a synchronization-type semiconductor memory device which operates in synchronism with a clock signal supplied from the outside of the semiconductor memory device.

8. The semiconductor memory device as claimed in claim 2, wherein the semiconductor memory device is a synchronization-type semiconductor memory device which operates in synchronism with a clock signal supplied from the outside of the semiconductor memory device.

9. The semiconductor memory device as claimed in claim 6, wherein the semiconductor memory device is a synchronization-type semiconductor memory device which operates in synchronism with a clock signal supplied from the outside of the semiconductor memory device.

10. The semiconductor memory device as claimed in claim 3, wherein the second means is arranged in a vicinity of the plurality of banks and generates the bank select signals on the basis of time constants of resistances and capacitances located between the second means and the plurality of banks.

11. A semiconductor memory device including a plurality of banks each having a memory cell array and sense amplifiers, a data input/output circuit and an address circuit, said semiconductor memory device comprising:

a refresh signal generating circuit which receives control signals from an outside of the semiconductor memory device and generates a refresh signal therefrom;

a bank signal select signal generating circuit which generates bank select signals in response to the refresh signal, the bank select signals being used to select the plurality of banks; and a latch enable signal generating circuit which receives the bank select signals and generating latch enable signals therefrom, the latch enable signals driving the sense amplifiers provided in the plurality of banks, a refresh operation being carried out by activating the sense amplifiers by the latch enable signals.

* * * * *